United States Patent [19]
Ohashi

[11] Patent Number: 5,376,026
[45] Date of Patent: Dec. 27, 1994

[54] METHOD OF MOUNTING A TAB TYPE MALE TERMINAL AND AN ASSEMBLY OF TAB TYPE MALE TERMINALS

[75] Inventor: Koji Ohashi, Saitama, Japan

[73] Assignee: Kyoshin Kogyo Co., Ltd., Japan

[21] Appl. No.: 224,069

[22] Filed: Apr. 7, 1994

Related U.S. Application Data

[63] Continuation of Ser. No. 21,499, Feb. 23, 1993, abandoned.

[30] Foreign Application Priority Data

Feb. 24, 1992 [JP] Japan .................. 4-072216

[51] Int. Cl.⁵ ............................................. H01R 4/02
[52] U.S. Cl. ................................. 439/885; 29/843; 439/83; 439/876; 439/884
[58] Field of Search ............... 439/83, 84, 876, 884, 439/885, 78; 29/839, 840, 843–845

[56] References Cited

U.S. PATENT DOCUMENTS

| | | | |
|---|---|---|---|
| 3,718,895 | 2/1973 | Reynolds et al. | 439/876 |
| 3,937,553 | 2/1976 | Maximoff et al. | 439/876 |
| 4,343,530 | 8/1982 | Leger | 439/876 |
| 4,436,358 | 3/1984 | Coldren et al. | 439/83 |
| 4,688,866 | 8/1987 | Legrady | 439/78 |
| 5,299,941 | 4/1994 | Ohashi | 439/885 X |

Primary Examiner—Steven C. Bishop
Attorney, Agent, or Firm—Pearne, Gordon, McCoy & Granger

[57] ABSTRACT

A tab type male terminal intended for circuit board mounting comprising a body of terminal tab and mounting legs provided integrally with the terminal tab body to extend through respective terminal mounting holes in a circuit board to be soldered to an electrically conducting layer on the circuit board and having reinforcing projection means integrally provided with the terminal tab body between the adjacent mounting legs and inserted into a slot type common terminal mounting hole and soldered to the electrically conducting layer on the circuit board together with the mounting legs so as to more securely mount the tab type male terminal onto the circuit board.

13 Claims, 5 Drawing Sheets

METHOD OF MOUNTING A TAB TYPE MALE TERMINAL AND AN ASSEMBLY OF TAB TYPE MALE TERMINALS

This is a continuation of application Ser. No. 08/021,499, filed Feb. 23, 1993, now abandoned.

BACKGROUND OF THE INVENTION

This invention relates to an improvement of tab type male terminals to be provided on and electrically and mechanically connected to a circuit board such as a printed circuit board of various electrical instruments. This invention also relates to a method of mounting the tab type male terminals on the circuit board through the steps of feeding a lead frame having a plurality of tab type male terminals mounted thereon, cutting the tab type male terminals out of the lead frame one by one, inserting the mounting legs of the tab type male terminals into the terminal mounting holes in the circuit board and soldering them to an electrically conducting layer on the circuit board.

Such tab type male terminals are commercially available as ones for Faston connector (the trademark) from AMP Inc. of U.S.A.

There has been used an automatic part inserting machine for continuously inserting a plurality of tab type male terminals into respective terminal mounting holes in a circuit board. The tab type male terminals which are to be inserted by such an automatic part inserting machine are in the form of taped terminals or a terminal tape-like assembly comprising a plurality of tab type male terminals mechanically connected with each other in a spaced manner and having a perforation which feeding pawls of a sprocket wheel in the automatic part inserting machine engage.

In general, such tab type male terminals comprise a terminal tab body having at least two mounting legs provided intergrally with the terminal tab body to extend through respective terminal mounting holes in the circuit board of various electrical instruments.

The automatic part inserting machine feeds the respective tab type male terminals to a terminal mounting position by rotation of the sprocket of the automatic part inserting machine, separately cuts each tab type male terminal at its mounting legs from the terminal tape and inserts the mounting legs of the tab type male terminal into the terminal mounting holes in the circuit board so that they extend therethrough while grasping them. Thereafter, the tab type male terminal has the mounting legs bent on an underside side of the circuit board toward an electrically conducting layer thereon and soldered thereto so that they are electrically and mechanically connected to the electrically conducting layer.

However, since the tab type male terminals are physically supported on the circuit board only by the two mounting legs, they are mounted on the circuit board with relatively lower strength. This disadvantageously causes the tab type male terminals to be damaged at their leg mounting portions when connector female terminals are engaged with the tab type male terminals and are disengaged therefrom.

In addition thereto, since an electric current flows only through the mounting legs of the tab type male terminals, they have lower capacitance. Thus, the conventional tab type male terminals cannot be used for high capacitance instruments.

SUMMARY OF THE INVENTION

Accordingly, it is a principal object of the invention to provide a method of mounting a tab type male terminal on a circuit board having higher physical strength with which they are mounted.

It is another object of the invention to provide a method of mounting a tab type male terminal on a circuit board having higher capacitance so that it can be used for high capacitance instruments.

It is a further object of the invention to provide a terminal tape-like assembly having a plurality of tab type male terminals adapted to be mounted on a circuit board having higher physical strength with which they are mounted.

It is a further object of the invention to provide a terminal tape-like assembly having a plurality of tab male terminals adapted to be mounted on a circuit board having higher capacitance so that it can be used for high capacitance instruments.

In accordance with one aspect of the present invention, there is provided a method of mounting a tab type male terminal on a circuit board comprising the steps of providing a tab type male terminal comprising a terminal tab body having at least two mounting legs provided intergrally with said terminal tab body, extending said mounting legs of said tab type male terminal through a circuit board and soldering said mounting legs onto an electrically conducting layer on said circuit board, said method characterized in that said tab type male terminal further comprises reinforcing projection means integrally provided with said terminal tab body between said adjacent mounting legs while said circuit board has a common terminal mounting hole into which said mounting legs and said reinforcing projection means are inserted; and said reinforcing projection means is soldered together with said mounting legs onto said electrically conducting layer.

In accordance with another aspect of the present invention, there is provided a method of mounting a tab type male terminal on a circuit board comprising the steps of feeding to a terminal mounting position a terminal tape-like assembly having a plurality of tab type male terminals comprising a body of a terminal tab having at least two mounting legs, separately cutting each tab type male terminal at its mounting legs from said terminal tape-like assembly, extending said mounting legs of the tab type male terminal through a circuit board and soldering said mounting legs onto an electrically conducting layer on said circuit board; said method characterized in that said tab type male terminal further comprises reinforcing projection means integrally provided with said terminal tab body between said adjacent mounting legs while said circuit board has a common terminal mounting hole into which said mounting legs and said reinforcing projection means are inserted; and said reinforcing projection means is soldered together with said mounting legs onto said electrically conducting layer.

In accordance with further aspect of the present invention, there is provided a terminal tape-like assembly having a plurality of tab type male terminals each comprising a terminal tab body having at least two mounting legs to extend through a circuit board and to be soldered to an electrically conducting layer on said circuit board characterized in that; said tab type male terminal further comprises reinforcing projection means integrally provided with said terminal tab body between said adjacent mounting legs to be soldered to said electrically conducting layer on said circuit board.

With such reinforcing projection means integrally provided with the terminal tab body between the adjacent mounting legs thereof and soldered together with the mounting legs to the electrically conducting layer, the tab type male terminal has larger area where it is soldered to the electrically conductive layer.

Thus, it will be noted that the tab type male terminal is more securely mounted on the circuit board with higher physical strength. Therefore, when a connector female terminal is engaged with the tab type male terminal or disengaged therefrom, the mounting portions of the tab type male terminal are never damaged.

In addition thereto, since an electric current flows through the reinforcing projection means as well as the mounting legs of the tab type male terminal, it has higher capacitance. Thus, it will be noted that the tab type male terminal can be suitably used for high capacitance instruments.

BRIEF DESCRIPTION OF THE DRAWINGS

The above and other objects and features of the invention will be apparent from the description of the embodiments of the invention taken along with the accompanying drawings in which.

DETAILED DESCRIPTION OF THE EMBODIMENT

Figure 1:
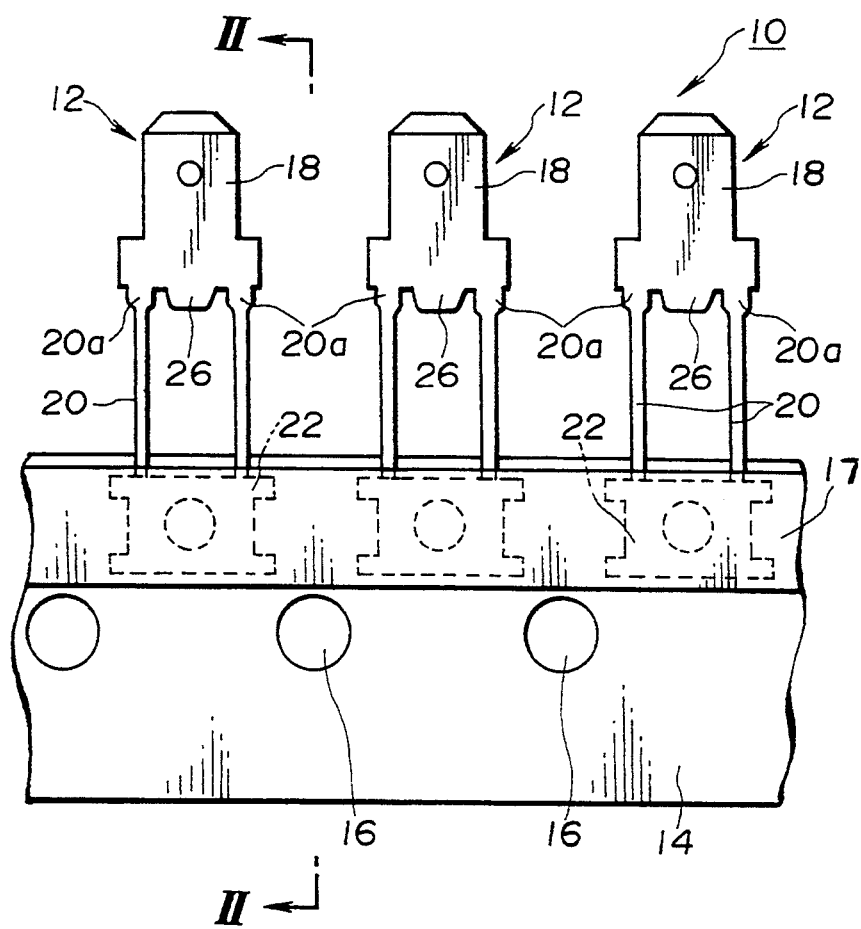
FIG. 1 is a front view of a portion of a terminal tape-like assembly comprising a plurality of tab type male terminals constructed in accordance with the invention.
Figure 2:
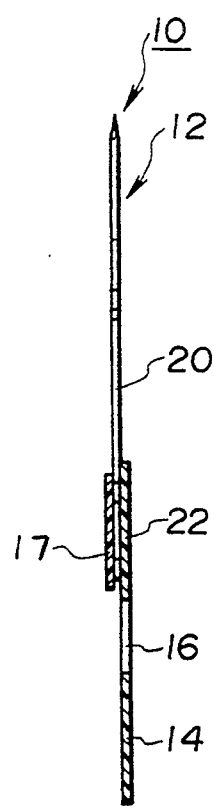
FIG. 2 is a cross sectional view of the terminal tape-like assembly taken along the line II —II of FIG. 1.
Figure 3:
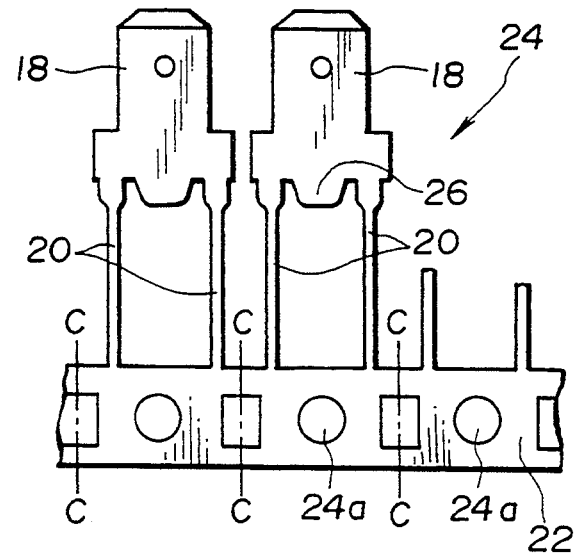
FIG. 3 is a front view of a plurality of tab type male terminals integrally formed by stamping a strip of electrically conducting metal in the form of lead frame for being used for manufacturing the terminal tape-like assembly of FIGS. 1 and 2.

Referring now to FIGS. 1, 2 and 3, there is shown a terminal tape or tape-like assembly 10 in the form of leading frame or taped parts which is to be used for the invention and which comprises a plurality of tab type male terminals 12 of electrically conducting metal such as copper, brass or copper alloy mechanically connected with each other in a spaced manner. In general, such terminals are called taped terminals.

In the illustrated embodiment, the terminal tape 10 comprises a supporting tape portion 14 which may be of paper or plastic material and has a perforation including a plurality of holes 16 provided at a distance corresponding to that of feeding pawls on a sprocket of an automatic part inserting machine not shown and an adhering tape portion 17 which may be of paper film and adheres the tab type male terminals 12 onto the supporting tape portion 14 so that the terminals 12 are held between the supporting tape portion 14 and the adhering tape portion 18.

Figure 4:
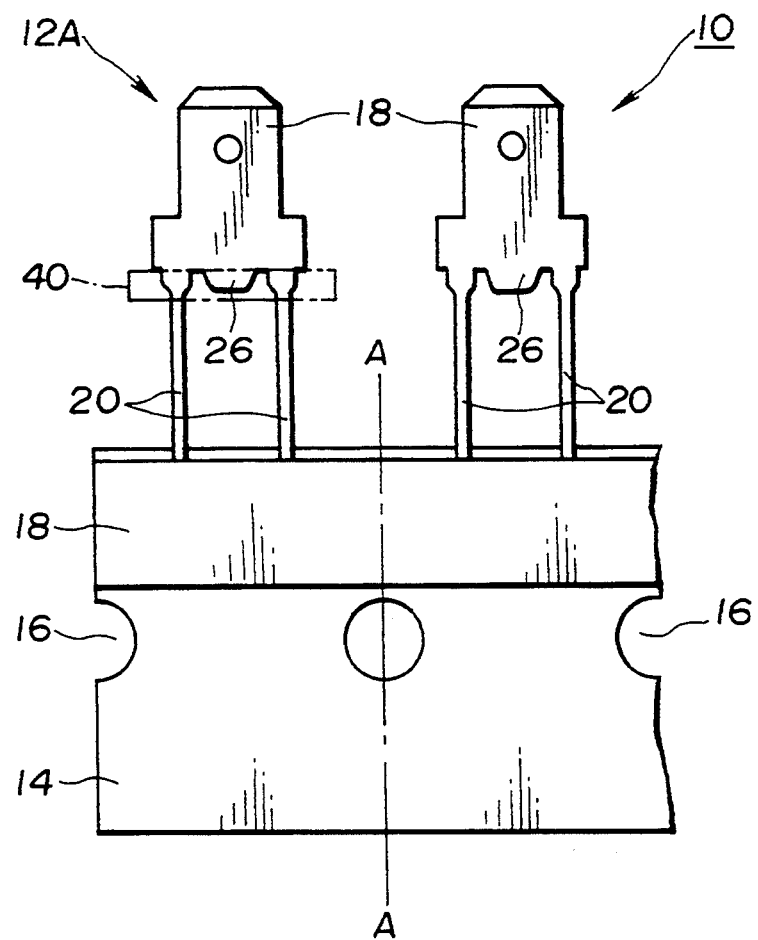
FIG. 4 illustrates in a front view a leading tab type male terminal of the terminal tape-like assembly being cut away from the subsequent tab type male terminals, which corresponds to a first step of the invention.
Figure 6:
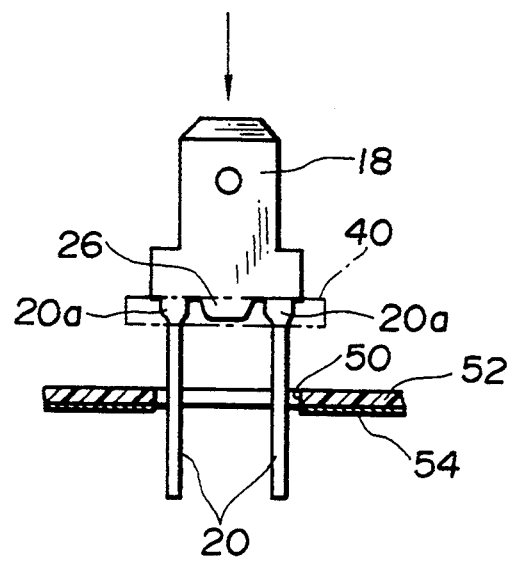
FIG. 6 illustrates in a front view one of the tab type male terminal being inserted into a slot type terminal mounting hole in a circuit board.
Figure 7:
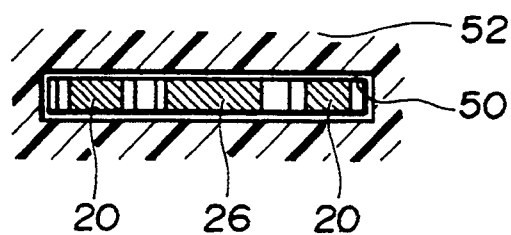
FIG. 7 is a horizontally cross sectional view of the circuit board at its slot type terminal mounting hole into which the legs of the tab type male terminal together with the reinforcing projection thereof are inserted.
Figure 8:
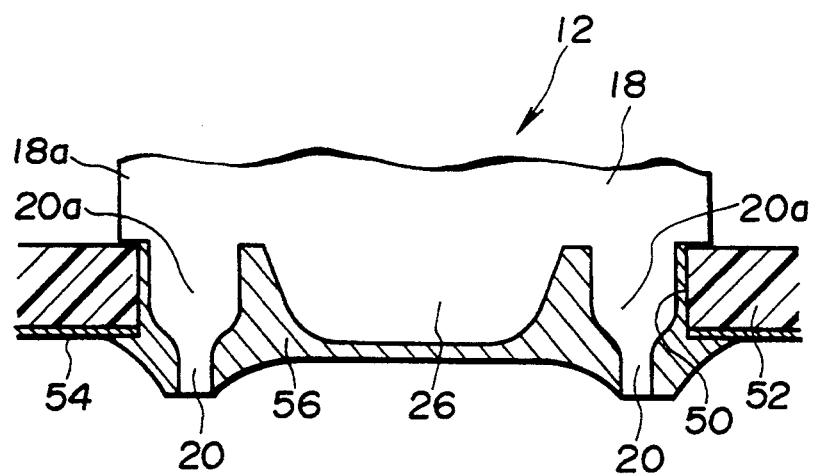
FIG. 8 illustrates in an enlarged form the mounting legs and the reinforcing projection inserted into the slot type terminal mounting hole and securely mounted on the circuit board by a soldering layer.

As shown in FIG. 4, each of the tab type male terminals 12 comprises a body 18 of a terminal tab which has a pair of mounting legs 20 integrally provided therewith to extend through a common slot type rectangular terminal mounting hole 50 in a circuit board 52 such as a printed circuit board as shown in FIGS. 6 through 8. The mounting legs 20 are electrically and mechanically connected to an electrically conducting layer 54 of copper foil adhered to the circuit board 52 in a predetermined pattern by a soldering layer 56 as described in detail later in connection with FIG. 8. As illustrated in FIGS. 1 through 3, the mounting legs 20 may have relatively wider portions 20a provided integrally with the terminal tab body 18 at bases of the mounting legs 20. The wider portions 20a are supposed to be positioned in the slot type mounting hole 50 which may be of rectangular shape as shown in FIG. 7.

Returning to FIG. 1, each of the tab type male terminals 12 may also comprise a carrier portion 22 integrally provided with the mounting legs 20 and having the form of a plate including a hole 24a (see FIG. 3). It will be noted that the carrier portions 22 of the tab type male terminals 12 may be integrally formed with each other as shown in FIG. 3 so that they continue at their carrier portions 22 in the form of lead frame 24. This lead frame 24 of the tab type male terminals 12 integrally formed at their carrier portions 22 may be easily formed by stamping a metal strip of copper, brass or copper alloy. It will be understood that the holes 24a constitute a perforation for feeding the lead frame 24 by sprocket feeding means.

Each of the tab type male terminals 12 is separated by cutting the lead frame 24 along a cutting line c—c at an intermediate portion between the adjacent tab type male terminals 12.

Thereafter, the thus separated terminals 12 are held between the supporting tape portion 14 and the adhering tape portion 17 by adhering the latter to the former so that the terminal tape-like assembly 10 is assembled.

A space between the adjacent tab type male terminals 12 of the terminal tape-like assembly 10 is set to be made equal to a pitch of a sprocket type feeder for feeding the terminal tape-like assembly 10 when they are held between the supporting tape portion 14 and the adhering tape portion 17 so that they are positioned at a distance different from that between the adjacent terminals 12 of the lead frame 24 of FIG. 3. As noted from FIG. 1, each of the tab type male terminals 12 is positioned at an intermediate portion between the adjacent feeding holes 16 of the perforation of the supporting tape portion 14. It will be understood that the lead frame 24 may be used for the invention, but in the case, the adjacent tab type male terminals 12 thereof are required to be so set to be positioned relative to each other having a larger pitch which corresponds to the feeding pawl distance of the automatic part inserting machine.

As shown in FIGS. 1 through 3, each of the tab type male terminals 12 comprises a single reinforcing projection 26 integrally provided with the terminal tab body 18 between the two mounting legs 20 in a manner spaced from the mounting legs 20. The reinforcing projection 26 of each of the tab type male terminals 12 is supposed to be inserted into the slot type rectangular mounting hole 50 together with the wider portions 20a of the mounting legs 20 as shown in FIGS. 7 and 8. Since the reinforcing projection 26 may be formed simultaneously with the leading frame 24 by stamping the metal strip, it has the same thickness as that of the terminal tab body 18. The reinforcing projection 26 may preferably be relatively wider between the mounting legs 20.

The tab type male terminals 12 are mounted on the circuit boards 52 with reference to FIGS. 4 through 6 in a manner as described immediately hereinafter.

The terminal tape-like assembly 10 is fed by a sprocket type feeder, the sprocket of which is engaged with the perforation in the supporting tape portion 14 of the terminal tape-like assembly 10 to a predetermined operating position where the automatic part inserting machine is operated to mount the respective tab type male terminals 12 on the corresponding circuit board 24.

As illustrated in FIG. 4, an inserting chuck 40 of the automatic part inserting machine grasps the leading tab type male terminal 12A of the terminal tape-like assembly 10 of FIG. 1 while a cutter (not shown) of the automatic part inserting machine cuts the terminal tape-like assembly 10 along a cutting line A—A of FIG. 4 so that the leading tab type male terminal 12A is removed from the subsequent tab type male terminals 12 of the terminal tape-like assembly 10.

Figure 5:
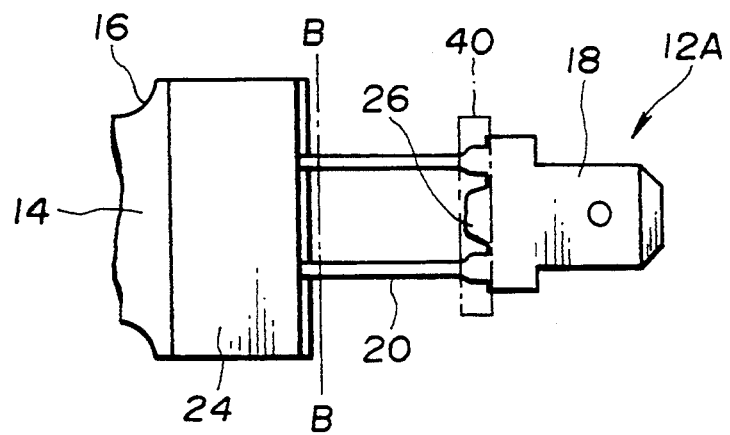
FIG. 5 illustrates in a front view the mounting legs of the tab type male terminal being cut away from a supporting tape, which is a second step of the invention.

Thereafter, as illustrated in FIG. 5, the removed leading tab type male terminal 12A is laid or placed horizontally while it is grasped by the inserting chuck 40 and the mounting legs 20 of the leading tab type male terminal 12A at their lower ends adjacent to the upper edge of the supporting tape portion 14 are cut by the same cutter as cuts the supporting tape portion 14 as indicated by a line B—B of FIG. 5 so that the supporting tape portion 14 together with the adhering tape portion 24 is removed from the tab type male terminal 12A.

As illustrated in FIG. 6, the thus separated tab type male terminal 12A is carried by the inserting chuck 40 of the inserting machine above the corresponding slot type rectangular terminal mounting hole 50 in the circuit board 52 where the tab type male terminal 12A is to be mounted.

After the inserting chuck 40 of the inserting machine inserts the two mounting legs 20 into the terminal mounting hole 50 as shown in FIG. 6 and is released from the terminal mounting legs 20, an inserting pusher (not shown) of the inserting machine lowerly pushes down the terminal 12A through a guiding chuck (not shown) until flanges 18a of the terminal tab body 18 engage an upper face of the circuit board 52 so that the wider portions 20a of the mounting legs 20 together with the reinforcing projection 26 are inserted into the corresponding slot type terminal mounting hole 50 in the circuit board 52 as shown in FIGS. 7 and 8.

Then, as illustrated in FIG. 8, a cutter (not shown) of the inserting machine cuts the mounting legs 20 of the terminal 12A at their portions which project just slightly from a lower face of the circuit board 52.

Finally, as illustrated in FIG. 8, the mounting legs 20 of the terminal 12A are soldered onto the electrically conducting layer 54 by an automatic soldering machine also not shown, so that the shortened mounting legs 20 together with the reinforcing projection 26 are embedded in the soldering layer 56 and also so that the mounting legs 20 of the terminal 12A together with the reinforcing projection 26 are electrically and mechanically connected to the electrically conducting layer 54.

The succeeding tab type male terminals 12 of the terminal tape-like assembly 10 can be also mounted on the circuit board 52 at the respective corresponding position thereof in the same manner as described with respect to the leading tab type male terminal 12A.

As noted from FIG. 8, since the soldering layer 56 is filled in the slot type rectangular hole 50 in the circuit board 52 so that it contacts the entire surface of the reinforcing projection 26 as well as the entire surfaces of the mounting legs 20 and the wider portions 20a thereof, the soldering layer 56 is allowed to have substantially larger area where it mechanically and electrically contacts the tab type male terminal 12.

Thus, it will be noted that the tab type male terminal 12 is more securely mounted on the circuit board 52 with higher physical strength. Therefore, when a connector female terminal is engaged with the tab type male terminal 12 or disengaged therefrom, such mounting portions as the mounting legs 20 and the reinforcing projection 26 of the tab type male terminal 12 will be never damaged.

In addition thereto, since an electric current flows through the reinforcing projection 26 as well as the mounting legs 20 of the tab type male terminal 12, it has higher capacitance. Thus, it will be noted that the tab type male terminal 12 can be used for high capacitance instruments.

Figure 9:
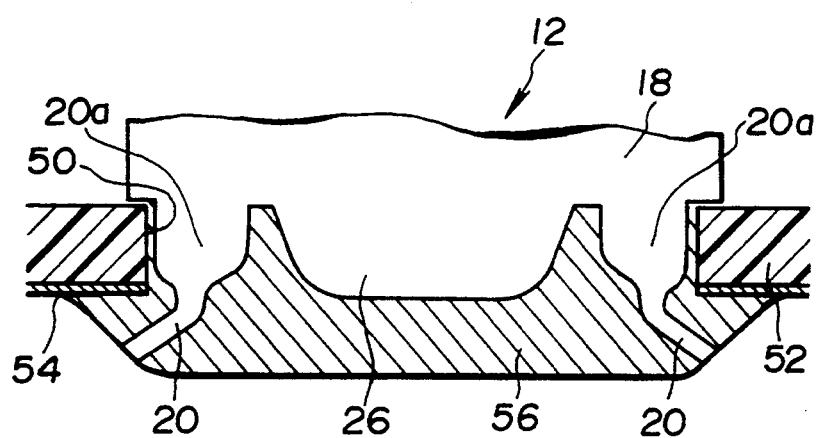
FIG. 9 illustrates in an enlarged form the mounting legs and the reinforcing projection inserted into the slot type terminal mounting hole and securely mounted on the circuit board in a modified form by a soldering layer.

As shown in FIG. 9, the mounting legs 20 may be so bent along the lower face of the circuit board 52 by a clincher (not shown) of the automatic part inserting machine that they engage the electrically conducting layer 54 on the circuit board 52 and the soldering layer 56 may contact the bent mounting legs 20.

Figure 10:
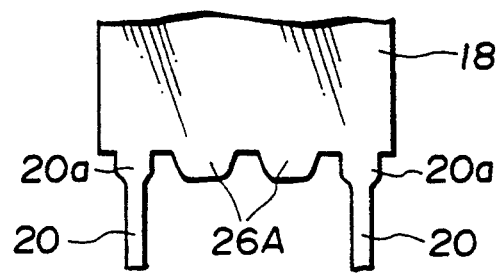
FIG. 10 is a front view of a portion of a tab type male terminal constructed in accordance with a first modification of the invention.
Figure 11:
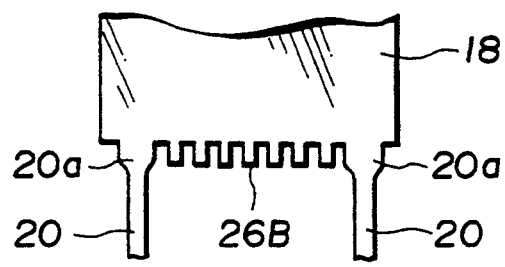
FIG. 11 is a front view of a portion of a tab type male terminal constructed in accordance with a second modification of the invention.
Figure 12:
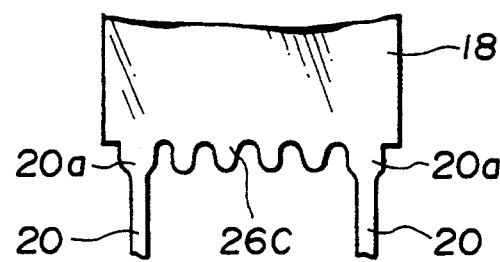
FIG. 12 is a front view of a portion of a tab type male terminal constructed in accordance with a third modification of the invention.

FIGS. 10 through 12 illustrate the tab type male terminal 12 having modified reinforcing projection means.

In the modification of FIG. 10, the tab type male terminal 12 may have two narrower reinforcing projections 26A provided integrally with the terminal tab body 18. In In the modification of FIG. 11, the tab type male terminal 12 may have a serrated reinforcing projection 26B provided integrally with the terminal tab body 18.

In the modification of FIG. 12, the tab type male terminal 12 may have a corrugated reinforcing projection 26C provided integrally with the terminal tab body 18.

It will be noted that the tab type male terminals 12 of FIGS. 10 through 12 are more preferable than those of FIGS. 1 through 8 because the formers may be mounted having higher physical strength and higher capacitance caused by larger area where they contact the soldering layer 56.

Although some embodiments of the invention have been described and illustrated with reference to the accompanying drawings, it will be understood by those skilled in the art that they are by way of examples, and that various changes and modifications may be made without departing from the spirit and scope of the invention. For example, individual tab type male terminals having reinforcing projection means may be mounted on the circuit board so that the reinforcing projection means together with the mounting legs is inserted into the slot type mounting hole in the circuit board. Also, although in the illustrated embodiments, the tab type male terminals have two mounting legs, they may have more than two mounting legs and reinforcing projection means between the adjacent two mounting legs. Thus, it should be understood that this invention is defined only to the appended claims.

What is claimed is:

1. A terminal tape-like assembly having a plurality of tab type male terminals each comprising a generally planar terminal tab body having at least two mounting legs to extend through a circuit board and to be soldered to an electrically conducting layer on said circuit board characterized in that;

each said tab type male terminal further comprises a reinforcing projection means integrally provided with said terminal tab body between said adjacent mounting legs to be soldered to said electrically conducting layer on said circuit board, said projection means having a thickness substantially the same as a thickness of said body and being substantially co-planar with said body.

2. The assembly of claim 1, wherein said mounting hole has a rectangular cross-section and said mounting legs have a flat profile adapted to be received within the cross-section of the mounting hole at spaced locations, and said reinforcing projection means has a similar flat profile extending between said mounting legs for receipt within said rectangular cross-section of said mounting hole.

3. A method of mounting a tab type male terminal on a circuit board having an electrically conducting layer and a mounting hole, said tab type male terminal comprising a generally planar terminal tab body having a lower end face with at least two adjacent mounting legs integrally projecting therefrom for mounting in said mounting hole and soldering to said electrically conducting layer, said method comprising the steps of:

providing reinforcing projection means integrally extending from said lower end face of said terminal tab body between said adjacent mounting legs, said projection means having a thickness substantially the same as a thickness of said body and being substantially co-planar with said body;

inserting said mounting legs and reinforcing projection means into said mounting hole, and soldering said mounting legs together with said reinforcing projection means onto said electrically conducting layer whereby the mounting legs and reinforcing projection means cooperate to provide increased mounting strength and electrical capacitance as compared with a similar tab type male terminal not having said reinforcing projection means.

4. The method of claim 3, wherein said mounting hole has a rectangular cross-section and said mounting legs have a flat profile adapted to be received within the cross-section of the mounting hole at spaced locations, and the step of providing said reinforcing projection means includes integrally forming said reinforcing projection means with a similar flat profile extending between said mounting legs for receipt within said rectangular cross-section of said mounting hole.

5. The method of claim 4, wherein the step of providing said reinforcing projection means further includes forming said reinforcing projection means with a thickness equal to that of said terminal tab body and mounting legs, and the step of soldering said mounting legs and reinforcing projection means includes disposing solder around said mounting legs and reinforcing projection means within said mounting hole.

6. The method of claim 3, wherein the step of providing said reinforcing projection means comprises forming a projection spaced from each of said two adjacent mounting legs.

7. The method of claim 3, wherein the step of providing said reinforcing projection means comprises forming a plurality of projections spaced from said adjacent mounting legs.

8. The method of claim 3, wherein the step of providing said reinforcing projection means comprises forming a serrated projection spaced from each of said two adjacent mounting legs.

9. The method of claim 3, wherein the step of providing said reinforcing projection means comprises forming a corrugated projection spaced from each of said two adjacent mounting legs.

10. The method of claim 3, wherein the step of providing said reinforcing projection means comprises forming a projection integrally with said mounting legs and spaced therefrom.

11. The method of claim 3, wherein said mounting legs include wider portions at the bases thereof and said reinforcing projection means extends from said lower end face a distance substantially equal to the extent of the wider portions of said mounting legs.

12. A method of mounting a tab type male terminal on a circuit board having a mounting hole and an electrically conducting layer comprising the steps of feeding to a terminal mounting position a taped terminal assembly means having a plurality of tab type male terminals each including a generally planar terminal tab body having a lower end face with at least two adjacent mounting legs projecting therefrom, providing said tab type male terminal with reinforcing projection means integrally formed with said terminal tab body between said adjacent mounting legs, said projection means having a thickness substantially the same as a thickness of said body and being substantially co-planar with said body, separately cutting each tab type male terminal at its mounting legs from said taped terminal assembly means, inserting said mounting legs and reinforcing projection means into said mounting hole, and soldering said reinforcing projection means together with said mounting legs onto said electrically conducting layer.

13. The method of claim 12, wherein said mounting hole has a rectangular cross-section and said mounting legs have a flat profile adapted to be received within the cross-section of the mounting hole at spaced locations, and the step of providing said reinforcing projection means includes integrally forming said reinforcing projection means with a similar flat profile extending between said mounting legs for receipt within said rectangular cross-section of said mounting hole.

* * * * *